United States Patent
Kim et al.

(10) Patent No.: US 7,046,760 B2
(45) Date of Patent: May 16, 2006

(54) METHOD OF MEASURING AND CONTROLLING CONCENTRATION OF DOPANTS OF A THIN FILM

(75) Inventors: Tae-Kyoung Kim, Yongin (KR); Sun-Yong Choi, Sungnam (KR); Chung-Sam Jun, Suwon (KR); Jeong-Hyun Choi, Yongin (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 232 days.

(21) Appl. No.: 10/789,445

(22) Filed: Mar. 1, 2004

(65) Prior Publication Data
US 2004/0224428 A1    Nov. 11, 2004

(30) Foreign Application Priority Data
Feb. 28, 2003    (KR)    .................. 10-2003-0012808

(51) Int. Cl.
G01N 23/223    (2006.01)
H01L 21/66    (2006.01)

(52) U.S. Cl. .............................. 378/45; 378/48; 438/14
(58) Field of Classification Search ............ 378/44–50, 378/83, 88; 438/14–17; 250/341.4; 324/750–752, 324/765, 767; 356/630, 369, 237.2, 432, 356/445
See application file for complete search history.

(56) References Cited

U.S. PATENT DOCUMENTS

| | | | |
|---|---|---|---|
| 4,795,260 A | 1/1989 | Schuur et al. | |
| 5,430,786 A | 7/1995 | Komatsu et al. | |
| 5,497,407 A | 3/1996 | Komatsu et al. | |
| 5,926,691 A | 7/1999 | Lim et al. | |
| 6,005,915 A * | 12/1999 | Hossain et al. | 378/86 |
| 6,040,198 A * | 3/2000 | Komiya et al. | 438/16 |
| 6,121,060 A | 9/2000 | Kameyama | |
| 6,173,036 B1 * | 1/2001 | Hossain et al. | 378/45 |
| 6,248,603 B1 * | 6/2001 | Jones et al. | 438/14 |
| 6,376,267 B1 * | 4/2002 | Noack et al. | 438/16 |
| 6,815,236 B1 * | 11/2004 | Kim et al. | 438/16 |
| 2003/0194053 A1 * | 10/2003 | Schramm et al. | 378/45 |
| 2003/0223536 A1 * | 12/2003 | Yun et al. | 378/45 |

FOREIGN PATENT DOCUMENTS

| | | | |
|---|---|---|---|
| JP | 356094243 A * | 7/1981 | |
| JP | 1070168 | 3/1989 | |
| JP | 6174665 | 6/1994 | |
| JP | 10-325786 | 12/1998 | |
| KR | 2000-0020758 | 4/2000 | |

* cited by examiner

Primary Examiner—Edward J. Glick
Assistant Examiner—Irakli Kiknadze
(74) Attorney, Agent, or Firm—Lee & Morse, P.C.

(57) ABSTRACT

A method of measuring a concentration of dopants of an objective thin film includes measuring a concentration of dopants of a first wafer, forming the objective thin film on the first wafer to form a second wafer, measuring a concentration of dopants of the second wafer, and obtaining the concentration of dopants of the objective thin film by subtracting the concentration of dopants of the first wafer from the concentration of dopants of the second wafer. Therefore, the concentration of dopants of the objective thin film may be measured without the use of a criterion wafer, thereby reducing measuring time. Also, the concentration of dopants of the objective thin film may be easily controlled, and therefore promptly corrected if necessary.

34 Claims, 7 Drawing Sheets

METHOD OF MEASURING AND CONTROLLING CONCENTRATION OF DOPANTS OF A THIN FILM

BACKGROUND OF THE INVENTION

1. Field of the Invention

The present invention relates to a method of measuring and controlling a concentration of dopants of a thin film in a process of manufacturing a semiconductor device. More particularly, the present invention relates to a method of measuring and controlling a concentration of dopants of a thin film using X-ray fluorescence spectroscopy.

2. Description of the Related Art

Recently, electronic apparatuses have become small in size and light in weight. A semiconductor device is essential to electronic apparatuses. Dopants are injected into an intrinsic semiconductor, so that a semiconductor device is manufactured. When dopants having three valence electrons are injected into an intrinsic semiconductor having four valence electrons, one of the four valence electrons is not paired, so that an acceptor is formed. When dopants having five valence electrons are injected into the intrinsic semiconductor having four valence electrons, one of the five valence electrons remains, so that a donor is formed. When the acceptor or the donor moves due to a difference of voltage, current flows. Therefore, electric characteristics of semiconductor devices are related to a concentration of dopants.

An amorphous silicon layer or a polysilicon layer into which dopants are injected is used for a capacitor or a transistor. Phosphorous (P) may be used as the dopant.

In a conventional method for injecting dopants, an amorphous silicon layer or a polysilicon layer is deposited on a substrate first, and then dopants such as phosphorous are injected into the amorphous silicon layer or the polysilicon layer via a $POCl_3$ process.

More recently, an amorphous silicon layer or a polysilicon layer including dopants, such as phosphorous, is deposited directly onto the substrate.

The concentration of dopants may be measured using X-Ray Fluorescence (XRF) or Secondary Ion Mass Spectroscopy (SIMS). SIMS is very sensitive to a surface condition of the amorphous silicon layer or of the polysilicon layer. Further, SIMS is an intrinsically destructive method of measuring the concentration of dopants. Therefore, X-ray fluorescence, which is a characteristic X-ray, is more frequently used for measuring a concentration of dopants.

In a conventional method of measuring concentration of dopants, light having a specific wavelength range is irradiated onto a thin film including dopants. Then, optical characteristics such as refractivity, an absorption ratio or a reflection ratio are measured to analyze the concentration of the dopants. In detail, a thin film having a specific concentration of dopants is deposited on a wafer that is not patterned, so that a criterion wafer is formed. The optical characteristics of the thin film deposited on the criterion wafer, such as the refractivity, the absorption ratio or the reflection ratio, are measured. A correlation between the specific concentration of dopants and the optical characteristics is induced. Then, the optical characteristics of an objective thin film deposited on a wafer that is patterned are measured. Measured data of the objective thin film are compared with the correlation, so that the concentration of the dopants of the objective thin film is obtained.

However, the method described above requires use of the criterion wafer. The criterion wafer that is not patterned is specially manufactured to reflect a real wafer that is patterned.

In a conventional semiconductor device manufacturing process, a plurality of thin films including dopants is deposited and patterned in sequence. When the concentration of dopants of each thin film is measured using the criterion wafer, a plurality of the criterion wafers corresponding to each of the thin films is required. Each criterion wafer is costly to manufacture in both expense and time, and therefore, productivity is low.

Furthermore, a significant amount of time is needed to measure the concentration of dopants. Therefore, when defects of the concentration of dopants are detected, a large number of wafers manufactured during a measuring time are wasted.

SUMMARY OF THE INVENTION

The present invention provides a method for direct measurement of a concentration of dopants of an objective thin film deposited on a real wafer without a criterion wafer, thereby reducing measuring time.

The present invention provides a method of controlling a concentration of dopants of a wafer promptly, thereby increasing productivity.

According to an embodiment of the present invention, It is a feature of an embodiment of the present invention to provide a method of measuring a concentration of dopants of an objective thin film, including measuring a concentration of dopants of a first wafer, forming the objective thin film on the first wafer to form a second wafer, measuring a concentration of dopants of the second wafer, and obtaining the concentration of dopants of the objective thin film by subtracting the concentration of dopants of the first wafer from the concentration of dopants of the second wafer.

The concentration of dopants of the first and second wafers may be measured using X-ray fluorescence.

Measuring the concentration of dopants of the first and second wafers may include preparing a look-up-table showing a correlation between concentrations of dopants and intensities of X-ray fluorescence, and comparing data of the look-up-table with intensities of X-ray fluorescence intensities emitted from the first and second wafers, respectively, to measure the concentrations of dopants of the first and second wafers, respectively.

The look-up-table is preferably prepared by recording intensities of X-ray fluorescence emitted from a wafer having a test thin film of the objective thin film while changing a concentration of dopants of the test thin film, checking whether sufficient data is obtained, and forming a table of the X-ray fluorescence intensities emitted from the wafer.

Forming the table preferably includes writing the concentrations of dopants in a first direction, and writing the intensities of X-ray fluorescence, which correspond to the concentrations of dopants, in a second direction.

The method may further include forming a graph, which includes representing on a first axis the concentrations of dopants, representing on a second axis, which is perpendicular to the first axis, the intensities of X-ray fluorescence, and generating points at intersections of particular intensities of X-ray fluorescence and corresponding concentrations of dopants and connecting the points to form a curve.

The objective thin film may be formed of polysilicon.

The objective thin film may be formed of amorphous silicon.

The first and second wafers may have a pattern formed thereon.

Measuring the concentration of dopants of the first and second wafers may include preparing a look-up-table including a correlation between thicknesses of test film of the objective thin film and intensities of X-ray fluorescence, and including a correlation between concentrations of dopants and intensities of X-ray fluorescence, and comparing data of the look-up-table with intensities of X-ray fluorescence emitted from the first and second wafers, respectively, to measure the concentration of dopants of the first and second wafers, respectively.

The look-up-table is preferably prepared by recording intensities of X-ray fluorescence emitted from a wafer having a first test thin film of the objective thin film while changing a concentration of dopants of the first test thin film, recording intensities of X-ray fluorescence emitted from a wafer having a second test thin film of the objective thin film while changing a thickness of the second test thin film, and forming a table of the intensities of X-ray fluorescence emitted from the wafers having the first and second test thin films.

Preparing the table preferably includes writing the concentrations of dopants in a first direction, writing the thicknesses in a second direction, and writing the intensities of X-ray fluorescence corresponding to the concentrations of dopants and the thicknesses at a corresponding region.

The method may further include forming a graph, which includes representing on a first axis the concentrations of dopants, representing on a second axis, which is perpendicular to the first axis, the thicknesses, and representing on a third axis, which is perpendicular to the first axis and the second axis, the X-ray fluorescence intensities; and, generating points at corresponding X-ray fluorescence intensities, concentrations of dopants and thicknesses, and connecting the points to form a surface.

Another embodiment of the present invention provides a method of controlling a concentration of an objective thin film, including selecting a first sample wafer, measuring a concentration of dopants of the first sample wafer, forming the objective thin film on the first sample wafer to form am second sample wafer, measuring a concentration of dopants of the second sample wafer, obtaining a concentration of dopants of the objective thin film by subtracting the concentration of dopants of the first sample wafer from the concentration of dopants of the second sample wafer, determining whether the concentration of dopants of the objective thin film is within a predetermined allowable range of error, continuing a process of depositing the objective thin film when the concentration of dopants of the objective thin film is within the allowable range of error, and modulating the concentration of dopants of the objective thin film when the concentration of dopants of the objective thin film is outside of the allowable range of error.

The concentrations of dopants of the first and second sample wafers may be measured using X-ray fluorescence.

Measuring the concentrations of dopants of the first and second sample wafers may include preparing a look-up-table showing a correlation between a concentration of dopants and intensities of X-ray fluorescence of test thin films of the objective thin film, and comparing data of the look-up-table with intensities of X-ray fluorescence emitted from the first and second sample wafers, respectively, to measure the concentrations of dopants of the first and second sample wafers, respectively.

The look-up-table may be prepared by recording intensities of X-ray fluorescence emitted from a wafer having a test thin film of the objective thin film while changing a concentration of dopants of the test thin film, checking whether sufficient data is obtained, and forming a table of the intensities of X-ray fluorescence emitted from the wafer.

The method may further include writing the concentrations of dopants of the test thin film of the objective thin film in a first direction, and writing the intensities of X-ray fluorescence corresponding to the concentrations of dopants in a second direction.

The method may further include representing on a first axis the concentrations of dopants, representing on a second axis, which is perpendicular to the first axis, the intensities of X-ray fluorescence, and generating points at intersections of the intensities of X-ray fluorescence and corresponding concentrations of dopants and connecting the points to form a curve as a graph.

The objective thin film may be formed of polysilicon.

The objective thin film may be formed of amorphous silicon.

The first and second wafers may have a pattern formed thereon.

Measuring the concentrations of dopants of the first and second sample wafers preferably includes preparing a look-up-table showing a correlation between concentrations of dopants and X-ray fluorescence intensities of test thin films of the objective thin film, and comparing data of the look-up-table with intensities of X-ray fluorescence emitted from the first and second sample wafers, respectively, to measure the concentrations of dopants of the first and second sample wafers, respectively.

The look-up-table is preferably prepared by recording intensities of X-ray fluorescence emitted from a wafer having a first test thin film of the objective thin film while changing a concentration of dopants of the first test thin film, recording intensities of X-ray fluorescence emitted from a wafer having a second test thin film of the objective thin film while changing a thickness of the second test thin film, and forming a table of the intensities of X-ray fluorescence emitted from the wafers having the first and second test thin films.

Forming the table may include writing the concentrations of dopants in a first direction, writing the thicknesses in a second direction, and writing the X-ray fluorescence intensities corresponding to the concentrations of dopants and the thicknesses at corresponding regions.

The method may further include representing on a first axis the concentrations of dopants, representing on a second axis, which is perpendicular to the first axis, the thicknesses, and representing on a third axis, which is perpendicular to the first axis and the second axis, the intensities of X-ray fluorescence, and generating points at corresponding intensities of X-ray fluorescence, concentrations of dopants and thicknesses, and connecting the points to form a curved plane as a graph.

Another embodiment of the present invention provides a method of measuring a concentration of dopants of an objective thin film, including measuring an intensity of a first X-ray fluorescence emitted from a first wafer, forming the objective thin film on the first wafer to form a second wafer, measuring an intensity of a second X-ray fluorescence emitted from the second wafer, obtaining an intensity of a third X-ray fluorescence emitted from the objective thin film by subtracting the intensity of the first X-ray fluorescence from the intensity of the second X-ray fluorescence, and converting the intensity of the third X-ray fluorescence emitted from the objective thin film into the concentration of dopants of the objective thin film.

Converting the third X-ray fluorescence emitted from the objective thin film into the concentration of dopants of the objective thin film preferably includes preparing a look-up-table showing a correlation between concentrations of dopants and X-ray fluorescence intensities of test thin films of the objective thin film, and comparing data of the look-up-table with the third X-ray fluorescence emitted from the objective thin film to obtain the concentration of dopants of the objective thin film.

The look-up-tables are preferably prepared by recording intensities of X-ray fluorescence emitted from a wafer having a test thin film of the objective thin film while changing a concentration of dopants of the test thin film, checking whether sufficient data is obtained, and forming a table of the intensities of the X-ray fluorescence emitted from the wafer. Forming the tables preferably include writing the concentrations of dopants in a first direction, and writing the intensities of the X-ray fluorescence, which corresponds to the concentrations of dopants, in a second direction.

In the graphs, the curve, the surface and the curved plane and may be formed by interpolation.

According to the present invention, the concentration of dopants of the thin film is measured without the criterion wafer, so that measuring time is reduced. Therefore, the concentration of dopants of the thin film may be controlled promptly.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2003-12808, filed on Feb. 28, 2003, and entitled: "Method Of Measuring And Controlling Concentration Of Dopants Of A Thin Film," is incorporated by reference herein in its entirety.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
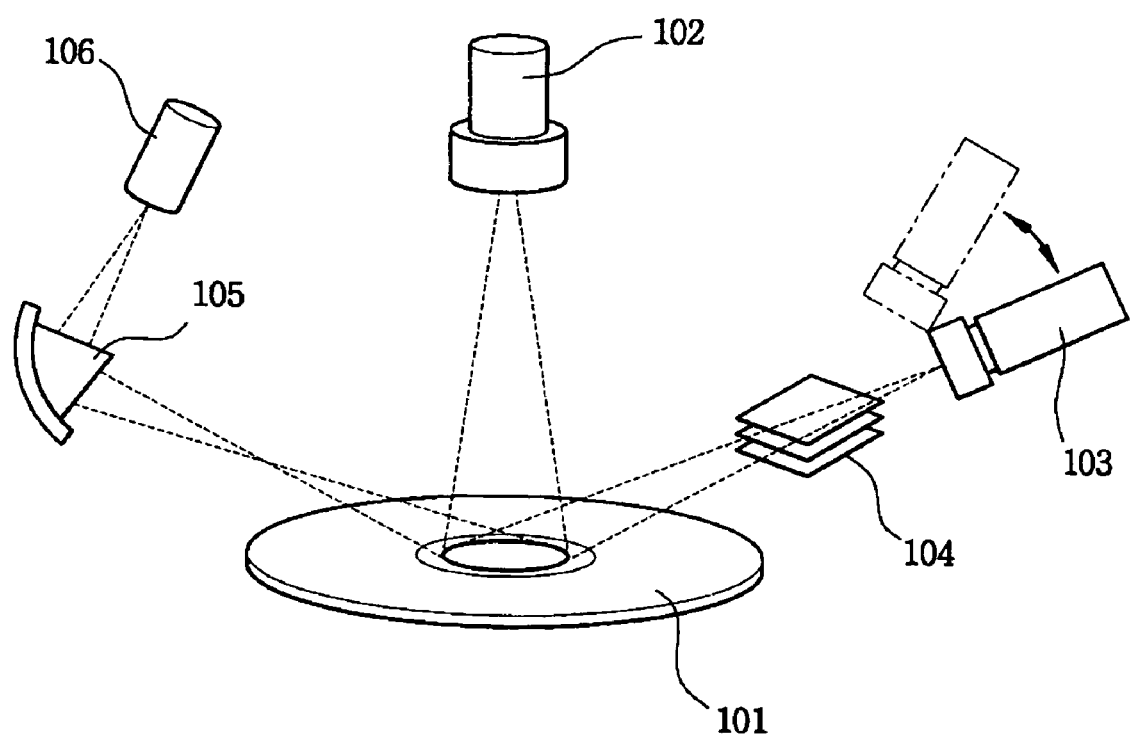
FIG. 1 illustrates a schematic view of an x-ray fluorescence spectrometer.

FIG. 1 illustrates a schematic view of an X-ray fluorescence spectrometer.

Referring to FIG. 1, an X-ray fluorescence spectrometer includes an X-ray generator 102, a receiving slit 104, a moving detector 103, an analyzing crystal 105 and a fixed detector 106. An X-ray that is generated from the X-ray generator 102 is irradiated onto a wafer 101, so that X-ray fluorescence (characteristic X-ray) is emitted from the wafer 101. The X-ray fluorescence passes through the receiving slit 104 to be detected by the moving detector 103, or the X-ray fluorescence passes through the analyzing crystal 105 to be detected by the fixed detector 106.

When an X-ray is irradiated onto a specific material, electrons in the material obtain energy from the X-ray, so that the electrons are transferred from a low energy level into a high energy level. However, electrons in a high energy level are unstable, and are transferred from the high energy level into the low energy level again, thereby generating the X-ray fluorescence.

In a case of a heavy element having an atomic number above 22 (titanium), the moving detector 103 is used to detect the X-ray fluorescence. In other cases, the fixed detector 106 is used to detect the X-ray fluorescence.

The X-ray generator 102 includes an X-ray tube (not shown), a high-voltage generator (not shown) and security circuits (not shown).

In the X-ray tube, thermal electrons are emitted from a filament including tungsten (W). The electrons are accelerated toward a cathode and collide with the cathode, so that the X-ray is generated. However, because the electrons advancing toward the cathode are spread out, electric fields are applied to focus the electrons.

The high-voltage generator supplies the X-ray tube with a high, negative polarity voltage.

Security circuits are incorporated to alarm an overload, a high voltage or a low voltage.

The receiving slit 104 concentrates the X-ray fluorescence. The analyzing crystal 105 analyzes the X-ray fluorescence according to a wavelength, in a manner similar to a prism analyzing visible light according to wavelength.

Recently, a proportional counter or a scintillation counter has been used as the moving detector 103 and the fixed detector 106. In the past, a Geiger-Müller counter was used as the moving detector 103 and the fixed detector 106. However, in the Geiger-Müller counter, a width of a linear region of a counting rate is narrow, and a life span is short. Therefore, the Geiger-Müller counter is currently seldom used.

The counter has a specific range of a resolving power. When a waveform is beyond the range of the resolving power, the waveform is distorted. Conventionally, a distorted waveform is compensated to enhance an accuracy of the concentration of dopants.

Figure 2:
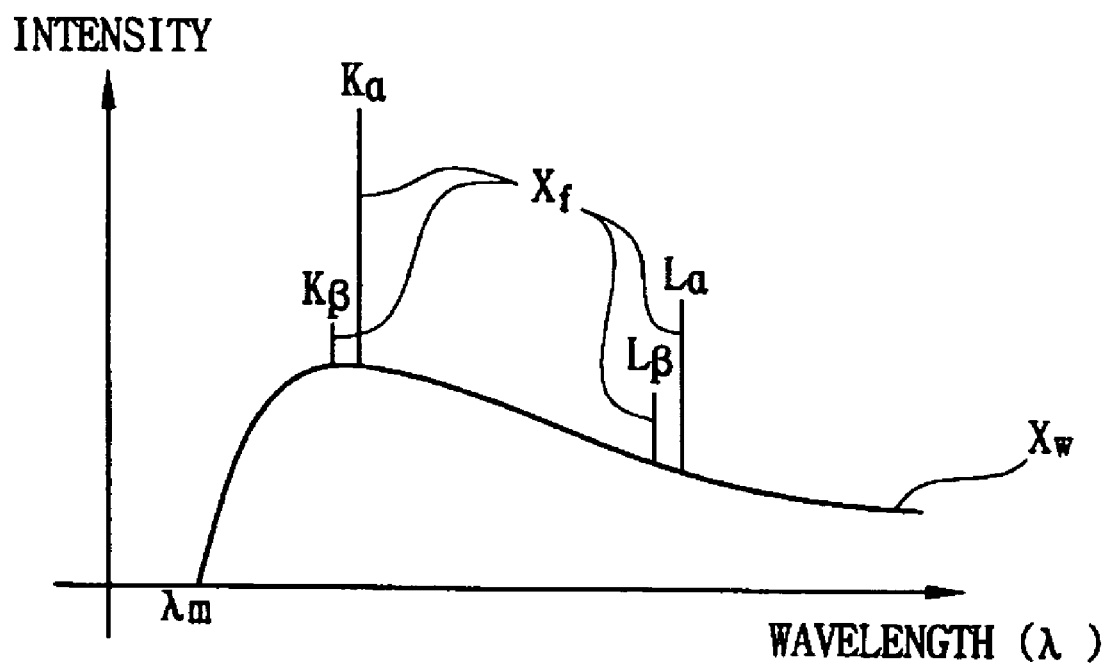
FIG. 2 is a graph showing a relationship between a spectrum of an x-ray fluorescent and an intensity of an X-ray fluorescent.

FIG. 2 is a graph showing a relationship between a spectrum of an X-ray fluorescent and an intensity of an X-ray fluorescent.

Referring to FIG. 2, the X-ray spectrum includes continuous X-rays (or white X-rays) Xw and characteristic X-rays (or X-ray fluorescence) Xf.

When electrons are accelerated and collide with a cathode, an X-ray is generated. Total kinetic energy of the electrons may be changed into energy of the X-ray. In this case, the energy of the X-ray has a maximum value. Therefore, the continuous X-ray has a shortest wavelength limit $\lambda_m$.

When an electron is accelerated due to a voltage V, the kinetic energy E of the electron equals eV, where 'e' is an electron charge.

Maximum energy of a photon of the X-ray fluorescence is represented by $hc/\lambda_m$, where 'h' is Plank's constant, 'c' is the speed of light, and '$\lambda_m$' is the shortest wavelength. The kinetic energy eV equals $hc/\lambda_m$, so that the minimum wavelength $\lambda_m$ of the X-ray fluorescence is represented by $hc/eV$. That is, the continuous X-ray is a Bremstrahlung radiation that is generated when a portion of the kinetic energy of the electron is transformed into photons of the X-ray fluorescence. Therefore, the continuous X-ray is distributed in a wavelength range that is larger than the minimum wavelength $\lambda_m$. A voltage applied to the X-ray generator determines a spectrum of the X-ray fluorescence. X-ray fluorescence having a wavelength that is substantially 1.5 times the minimum wavelength $\lambda_m$ has a maximum intensity.

A wavelength of the characteristic X-ray of an element is inherent. Therefore, a wavelength of the characteristic X-ray has different values for different elements (or atoms). Characteristic X-rays are classified into a K-group, an L-group, an M-group, etc.

An atom includes a nucleus and electrons. The electrons are disposed in a K-shell, an L-shell, an M-shell, etc. The K-shell encloses the nucleus. The L-shell encloses the K-shell. The M-shell encloses the L-shell. For example, the characteristic X-ray of the K-group is generated when an electron falls from a high-energy state to the K-shell. The characteristic X-ray of the L-group is generated when an electron falls from a high-energy state to the L-shell.

Characteristic X-rays of a same group may be further characterized into subgroups. For example, characteristic X-rays of the K-group are characterized into a Kα-subgroup, a Kβ-subgroup, etc. A characteristic X-ray of the Kα-subgroup is generated when an electron falls from the L-shell to the K-shell. A characteristic X-ray of the Kβ-subgroup is generated when an electron falls from the M-shell to the K-shell.

Similarly, a characteristic X-ray of an Lα-subgroup is generated when an electron falls from the M-shell to the L-shell, and a characteristic X-ray of the Lβ-subgroup is generated when an electron falls from the N-shell to the L-shell.

Energy levels of an atom of a first element are different from energy levels of an atom of a second, different element. That is, energy levels are intrinsic to elements, so that a wavelength of a characteristic X-ray of an element is intrinsic to the element. Therefore, when a characteristic X-ray is analyzed, the element may be identified.

Figure 3A:
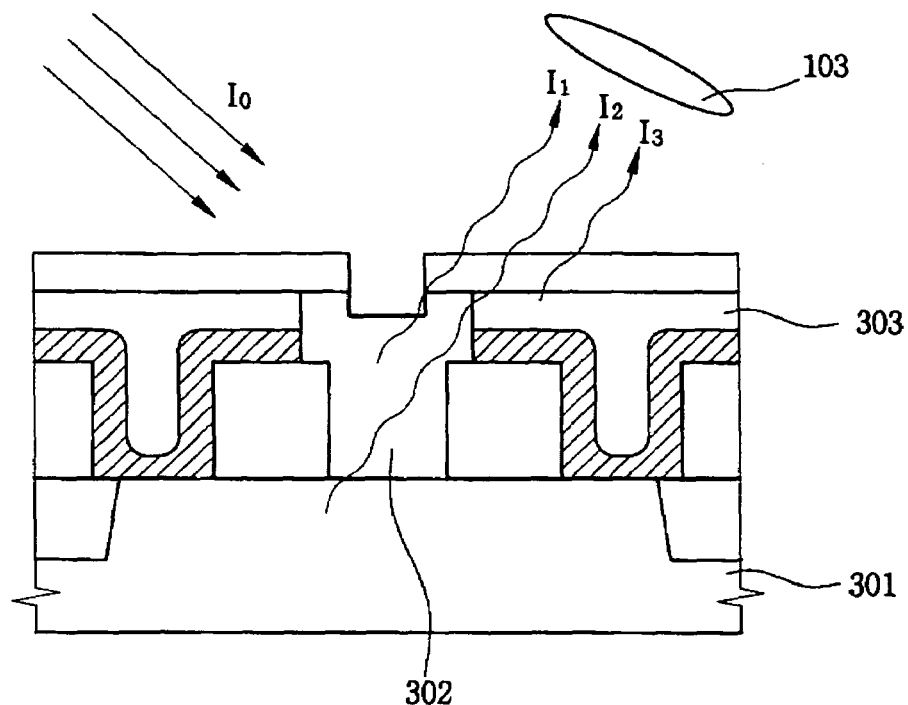
FIG. 3A illustrates a schematic cross-sectional view of an intensity of an X-ray fluorescent irradiated from a first wafer having no objective thin film deposited thereon.
Figure 3B:
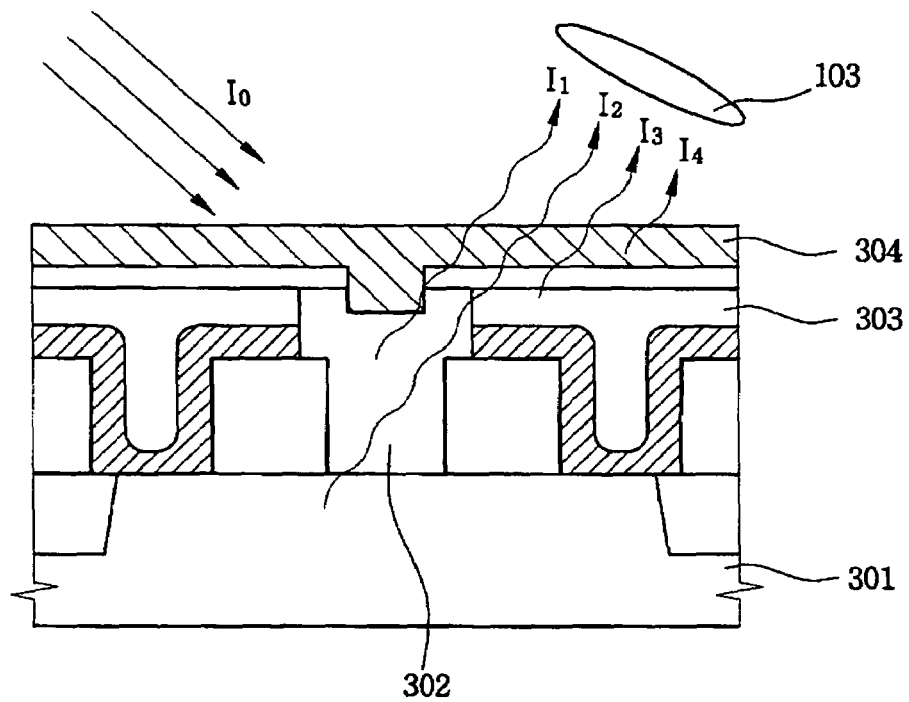
FIG. 3B illustrates a schematic cross-sectional view of an intensity of an X-ray fluorescent irradiated from a wafer having an objective thin film deposited thereon.

FIG. 3A illustrates a schematic cross-sectional view of an intensity of an X-ray fluorescent irradiated from a first wafer having no objective thin film deposited thereon. FIG. 3B illustrates a schematic cross-sectional view of an intensity of an X-ray fluorescent irradiated from a second wafer having an objective thin film deposited thereon.

X-rays have penetrating power. Therefore, when an X-ray fluorescent measures a concentration of dopants of an objective thin film 304, a concentration of dopants of any thin film disposed below the objective thin film 304 is detected together with the concentration of dopants of the objective thin film 304.

A method of measuring the concentration of dopants of the objective thin film 304 according to an embodiment of the present invention is described below.

In the context of the present invention, a wafer having no objective thin film deposed thereon is referred to as a first wafer, and a wafer having an objective thin film deposited thereon is referred to as a second wafer. An X-ray fluorescence emitted from the first wafer is referred to as a first X-ray fluorescence and an X-ray fluorescence emitted from the second wafer is referred to as a second X-ray fluorescence.

Referring to FIG. 3A, an X-ray $I_o$ is irradiated onto the first wafer. Then, a first X-ray fluorescence is emitted from the first wafer. For example, the first X-ray fluorescence includes a first sub X-ray fluorescence $I_1$, a second sub X-ray fluorescence $I_2$ and a third sub X-ray fluorescence $I_3$.

The first sub X-ray fluorescence $I_1$ is emitted from a pad insulation layer 302. The second sub X-ray fluorescence $I_2$ is emitted from a substrate 301. The third sub X-ray fluorescence $I_3$ is emitted from Boro-Phospho-Silicate Glass (BPSG) layer 303.

Referring to FIG. 3B, an X-ray $I_o$ is irradiated onto a second wafer. Then, a second X-ray fluorescence is emitted from the second wafer. For example, the second X-ray fluorescence includes a first sub X-ray fluorescence $I_1$, a second sub X-ray fluorescence $I_2$, a third sub X-ray fluorescence $I_3$ and a fourth sub X-ray fluorescence $I_4$.

The first sub X-ray fluorescence $I_1$ is emitted from a pad insulation layer 302. The second sub X-ray fluorescence $I_2$ is emitted from a substrate 301. The third sub X-ray fluorescence $I_3$ is emitted from a Boro-Phospho-Silicate Glass (BPSG) layer 303. The fourth sub X-ray fluorescence $I_4$ is emitted from an objective thin film 304.

Therefore, the fourth sub X-ray fluorescence $I_4$ emitted from the objective thin film 304 may be obtained by subtracting the first X-ray fluorescence from the second X-ray fluorescence.

Figure 4:
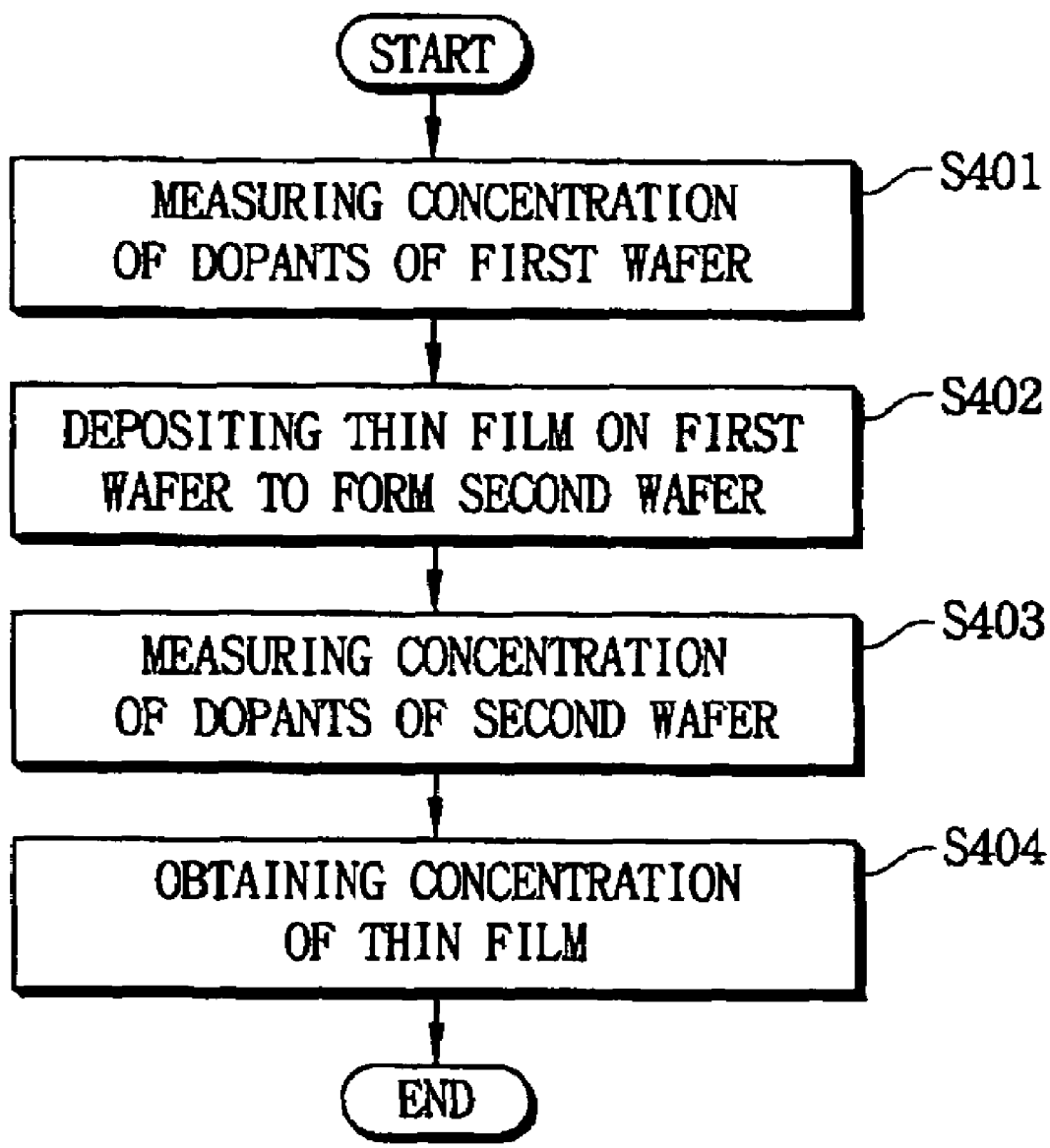
FIG. 4 is a flow chart showing a method of measuring a concentration of dopants of a thin film according to a first exemplary embodiment of the present invention.

FIG. 4 is a flow chart illustrating a method of measuring a concentration of dopants of a thin film according to a first exemplary embodiment of the present invention.

Referring to FIGS. 1 and 4, a first concentration of dopants of a first wafer having no objective thin film deposited thereon is measured (step S401). The first wafer is loaded on an X-ray fluorescence spectrometer. An X-ray generated from the X-ray generator 102 is irradiated onto the first wafer. The moving detector 103 or the fixed detector 106 detects a first X-ray fluorescence intensity emitted from the first wafer. The first X-ray fluorescence intensity is transformed into a first concentration of dopants. A method of obtaining the first concentration of dopants will be described later.

An objective thin film is deposited on the first wafer to transform the first wafer into a second wafer (step S402).

Then, a second concentration of dopants of the second wafer is measured (step S403). The second wafer is loaded onto the X-ray fluorescence spectrometer. The X-ray generated from the X-ray generator 102 is irradiated onto the second wafer. The moving detector 103 or the fixed detector 106 detects a second X-ray fluorescence intensity emitted from the second wafer. The second X-ray fluorescence intensity is transformed into a second concentration of dopants. A method of obtaining the second concentration of dopants will be described later.

A third concentration of dopants of the objective thin film is obtained by subtracting the first concentration of dopants from the second concentration of dopants (step S404).

In FIG. 4, the first concentration of dopants of the first wafer and the second concentration of dopants of the second wafer are measured. That is, the first intensity and the second intensity are transformed into the first concentration of dopants and the second concentration of dopants, respectively.

However, a third intensity may be obtained by subtracting the first intensity from the second intensity. The third intensity may be transformed into the third concentration of dopants. The X-ray decays when the X-ray penetrates into the wafer. Therefore, the third concentration of dopants obtained by subtracting the first concentration of dopants from the second concentration of dopants is more accurate than the third concentration of dopants obtained using only the third intensity.

Figure 5:
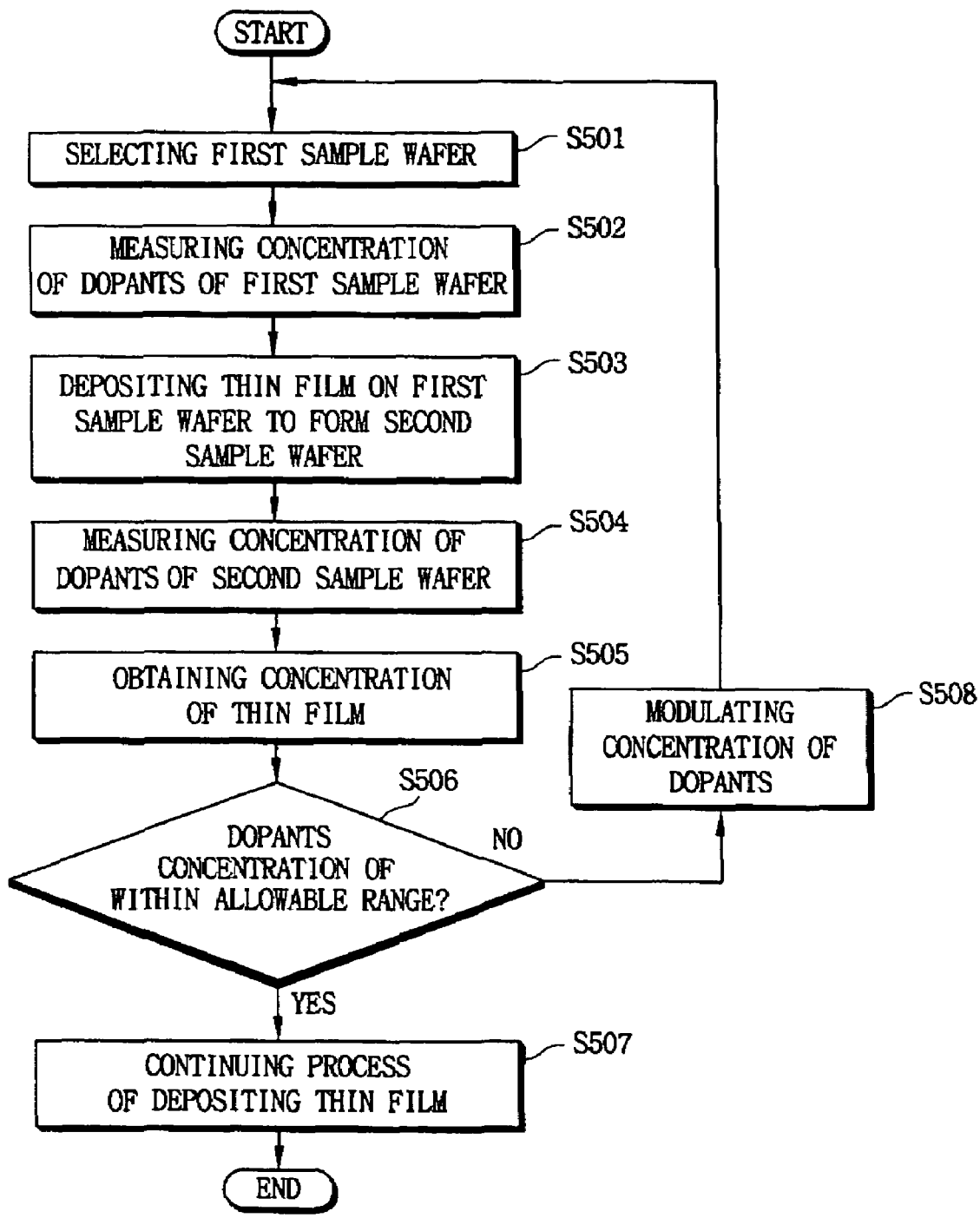
FIG. 5 is a flow chart showing a method of controlling a concentration of dopants of a thin film according to a second exemplary embodiment of the present invention.

FIG. 5 is a flow chart showing a method of controlling a concentration of dopants of a thin film according to a second exemplary embodiment of the present invention.

Referring to FIG. 5, a first (test) sample wafer is chosen among wafers undergoing a process of manufacturing a semiconductor device (step S501). Therefore, the first sample wafer is different from a criterion wafer. That is, a pattern is formed on the first sample wafer, whereas no pattern is formed on a criterion wafer.

A concentration of dopants of the first sample wafer is measured (step S502). The first sample wafer is loaded on an X-ray fluorescence spectrometer. An X-ray generated from the X-ray generator 102 is irradiated onto the first sample wafer. The moving detector 103 or the fixed detector 106 detects the X-ray fluorescence emitted from the first sample wafer. A method of measuring the first concentration of dopants will be described later.

An objective thin film is deposited on the test sample wafer, which is like any other first wafer undergoing the process of manufacturing the semiconductor device, so that the first sample wafer is transformed into a second sample wafer (step S503).

A concentration of dopants of the second sample wafer is measured (step S504). The second sample wafer is loaded on an X-ray fluorescence spectrometer. An X-ray generated from the X-ray generator 102 is irradiated onto the second sample wafer. The moving detector 103 or the fixed detector 106 detects the X-ray fluorescence emitted from the second sample wafer. A method of measuring the second concentration of dopants will be described later.

Then, a third concentration of dopants of the objective thin film is obtained by subtracting the first concentration of dopants from the second concentration of dopants (step S505).

The third concentration of dopants of the objective thin film is checked to determine whether the third concentration of dopants is within an allowable range of error (step S506).

When the third concentration of dopants is within the allowable range of error, the objective thin film is continuously deposited on other wafers (step S507). When the third concentration of dopants is outside of the allowable range of error, the third concentration of dopants of the objective thin film is modulated (step S508).

In FIG. 5, the third concentration of dopants is obtained by subtracting the first concentration of dopants from the second concentration of dopants. However, a third intensity may be obtained by subtracting the first intensity from the second intensity. Then, the third intensity may be transformed into the third concentration of dopants.

Hereinafter, a method of obtaining the third concentration of dopants of the objective thin film by the X-ray fluorescence intensity (or the characteristic X-ray) is described.

An X-ray fluorescence intensity is associated with a concentration of the dopants. That is, the higher the concentration of dopants, the stronger the X-ray fluorescence intensity. However, the X-ray fluorescence intensity is not directly proportional to the concentration of the dopants.

Therefore, a look-up-table is prepared to measure the concentration of dopants accurately. The look-up-table shows a relationship between the concentration of the dopants and the X-ray fluorescence intensity. Therefore, when the intensity is measured, the concentration of the dopants may be obtained using the look-up-table.

Hereinafter, a method of forming the look-up-table is described.

Figure 6:
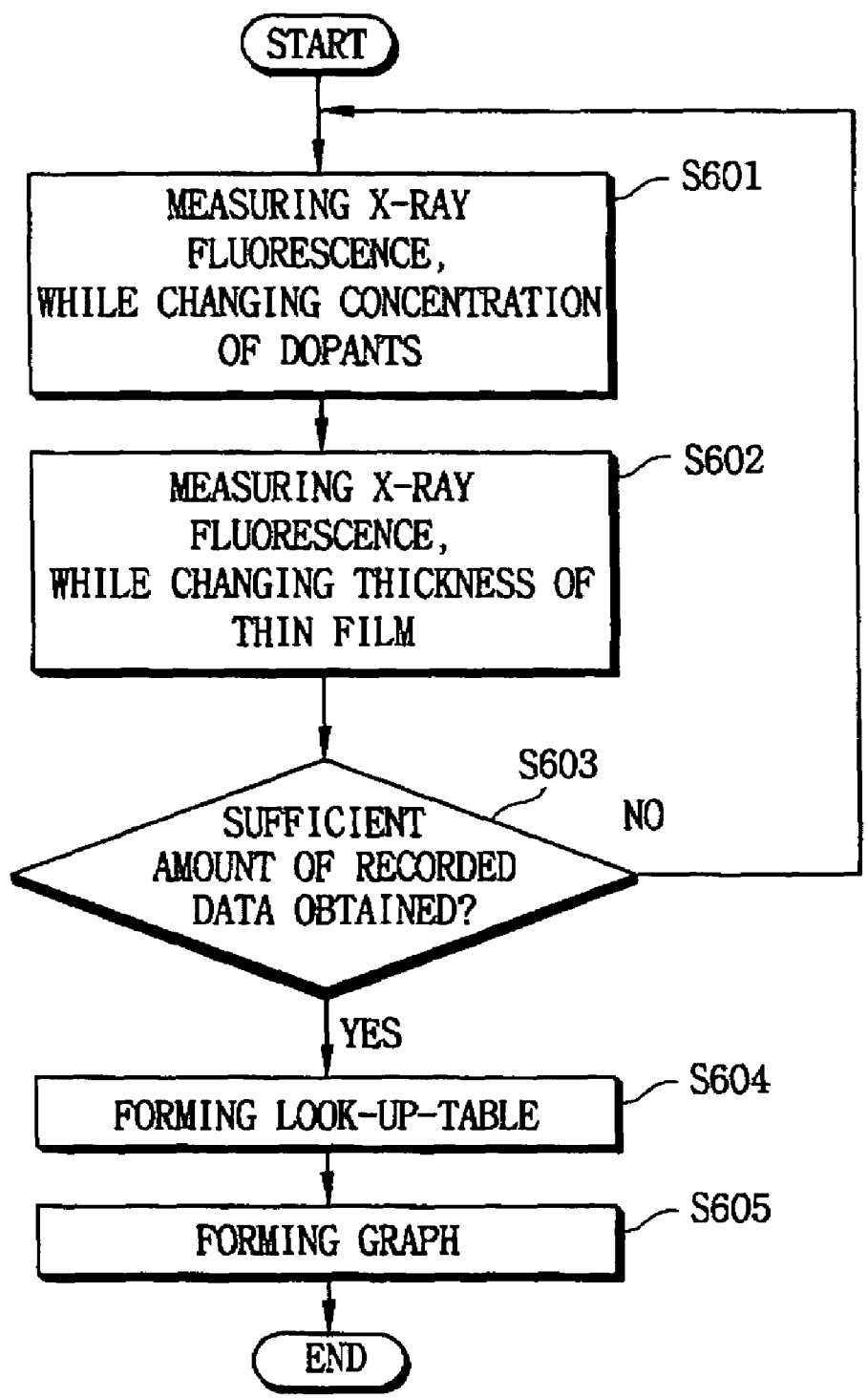
FIG. 6 is a flow chart showing a method of forming a look-up-table according to one embodiment of the present invention.

FIG. 6 is a flow chart showing a method of forming a look-up-table according to one embodiment of the present invention.

Referring to FIG. 6, the X-ray fluorescence intensity emitted from the objective thin film is measured and recorded while the concentration of the dopants of the objective thin film is changed, and a thickness of the objective thin film is fixed (step S601). Then, the X-ray fluorescence intensity emitted from the objective thin film is measured and recorded while the concentration of the dopants of the objective thin film is fixed, and a thickness of the objective thin film is changed (step S602).

Ranges for the thickness and concentration of dopants are determined by considering a variation of thickness and concentration of dopants that may occur during a manufacturing process of a semiconductor device.

The recorded data is checked to determine whether a sufficient amount of recorded data has been obtained (step S603). When there is not enough recorded data, the above steps S601 and S602 are repeated. When there is enough recorded data, a look-up-table is formed using the recorded data (step S604), and a continuous graph is formed using the look-up-table (step S605).

The look-up-table shows a relationship between the X-ray fluorescence intensity emitted from the objective thin film and the thickness of the objective thin film, and between the X-ray fluorescence intensity emitted from the objective thin film and the concentration of dopants of the objective thin film.

Step S602 may be omitted. In such a case, the look-up-table shows only the relationship between the X-ray fluorescence intensity emitted from the objective thin film and the concentration of the dopants in the objective thin film.

Hereinafter, a method of forming the look-up-table is described.

Concentrations of dopants of the objective thin film are written in a first direction, and thicknesses of the objective thin film are written in a second direction. Then, the X-ray fluorescence intensity emitted from the objective thin film at a corresponding region is written, so that the look-up-table is formed.

When the X-ray fluorescence intensity is measured, the intensity is compared with values in the look-up-table. Then, the thickness and the concentration of dopants of the thin film may be obtained by the look-up-table.

However, the measured X-ray fluorescence intensity may not be one of the values in the look-up-table because the look-up-table has only discrete values. In such a case, the thickness and the concentration of dopants of the thin film may not be easily obtained by the look-up-table. Therefore, a continuous graph is formed using the values in the look-up-table.

Hereinafter, a method of forming the graph is described.

For one example, a range of concentrations of dopants is represented on an X-axis and a corresponding range of X-ray fluorescence intensities is represented on a Y-axis. Points are generated at intersections of specific concentrations of dopants and X-ray fluorescence intensities corresponding thereto by relying on data in the look-up-table. The points are then connected by one-dimensional interpolation to form a smooth curve representing all concentrations of dopants and corresponding X-ray fluorescence intensities in a range of the curve.

For another example, a range of concentrations of dopants of the objective thin film is represented on the X-axis and a range of thicknesses of the objective thin film is represented on the Y-axis. Then, a range of X-ray fluorescence intensities corresponding to the concentration of dopants range and the thin film thickness range is represented on a Z-axis that is perpendicular to both the X-axis and the Y-axis by relying on data in the look-up-table. Points are generated at intersections of specific X-ray fluorescence intensities and concentrations of dopants and thicknesses of the thin film. The points are connected using two-dimensional interpolation to form a surface representing all possible combinations of thin film thickness and concentration of dopants and corresponding X-ray fluorescence intensity.

Interpolation is a method of estimating the value of a mathematical function that lies between known values. Even when a distance between the known values is different, interpolation may be used to estimate a value of the mathematical function.

When there are two variables for example, the thickness of the objective thin film and the concentration of the dopants, surface fitting is applied by two-dimensional interpolation.

When the distance between the known values is irregular, an algorithm such as Triangulated Irregular Network (TIN) is widely used. When the distance between the known values is regular, an algorithm such as bilinear interpolation or bicubic interpolation is widely used.

When a function having continuous values is formed from a look-up-table that has only discrete values, the concentration of dopants may be easily obtained from the X-ray fluorescence intensity.

Comparison between a result of a method according to an embodiment of the present invention as described above, and a conventional method using a criterion wafer is described in relation to Table 1.

TABLE 1

| | Intensity of X-ray fluorescence | | | |
| | | Method according to present invention | | |
| Measuring point | Conventional method using criterion wafer | Second wafer having thin film deposited thereon | First wafer having no thin film deposited thereon | Difference between the second wafer and the first wafer |
|---|---|---|---|---|
| Upper portion of wafer | 3.1659 | 3.3224 | 0.1955 | 3.1269 |
| Left portion of wafer | 3.1545 | 3.3173 | 0.1996 | 3.1177 |
| Center portion of wafer | 3.1139 | 3.2837 | 0.1977 | 3.0860 |
| Right portion of wafer | 3.1721 | 3.3286 | 0.1987 | 3.1299 |
| Lower portion of wafer | 3.1756 | 3.3197 | 0.1824 | 3.3173 |

Table 1 shows intensities of the X-ray fluorescence according to a conventional method using a criterion wafer and according to an embodiment of the present invention.

In Table 1, a unit of the X-ray fluorescence intensity is kilo count per second (kcps). That is, the X-ray fluorescence intensity is represented as a count (or number) of photons detected by a proportional counter or by a scintillation counter used as the moving detector 103 or the fixed detector 106 of FIG. 1.

Even when the value of the count is converted from 'kcps' into 'cps', a decimal fraction still exists. That is because the count (or number) is measured for a few seconds and converted into a count per second.

To produce the data in Table 1, the X-ray fluorescence intensity was measured at five points on a wafer, viz., an upper portion $P_1$, a left portion $P_2$, a center portion $P_3$, a right portion $P_4$ and a lower portion $P_5$. For example, the lower portion $P_5$ is disposed near a flat zone of the wafer or a notch of the wafer, and the upper portion $P_1$ is disposed opposite to the flat zone or the notch.

Difference ratios between the results obtained using the conventional method and the those obtained using a method of an embodiment of the present invention are respectively 1.23%, 1.17%, 0.90%, 0.13% and 1.21%. A difference ratio is represented by $[(Ig-Ip)/Ig] \times 100$, where Ig is an intensity measured by the general method and Ip is an intensity measured by a method of the present invention. The difference ratios are within the allowable range of errors. Therefore, the results show that a method of measuring concentration of dopants according to the present invention is reliable.

Further, a pattern formed by a graph of the intensities measured by the method of the present invention is similar to that of the conventional method.

Figure 7A:
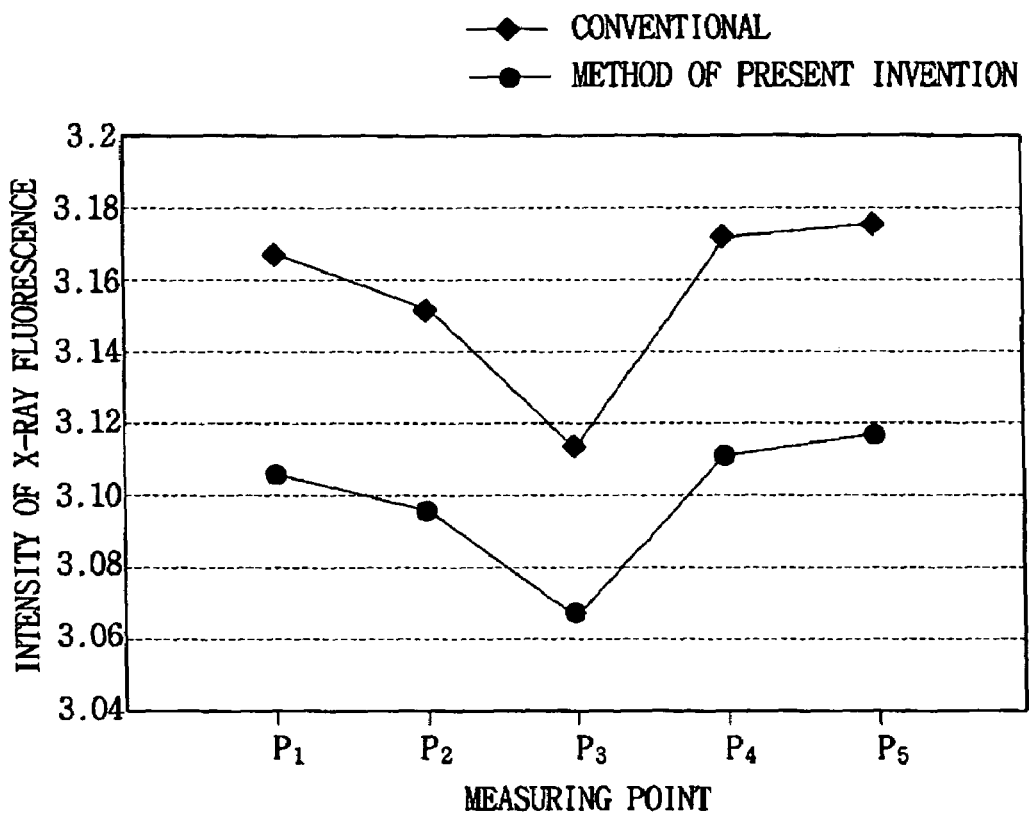
FIG. 7A is a graph showing an intensity of X-ray fluorescence according a measuring point.

FIG. 7A is a graph showing intensities of X-ray fluorescence according to measuring points on a wafer.

In FIG. 7A, the X-axis represents the measuring points, such as an upper portion $P_1$, a left portion $P_2$, a center portion $P_3$, a right portion $P_4$ and a lower portion $P_5$, which are indicated in sequence on the X-axis.

The Y-axis represents intensities of the X-ray fluorescence.

As shown in FIG. 7A, the intensities measured by the conventional method are different from the intensities measured by a method of the present invention. However, the graph patterns are similar. That is, both methods show that a concentration of dopants is higher in the upper portion $P_1$ and the lower portion $P_5$ of the wafer than in the center portion $P_3$ of the wafer.

An intensity difference between the general method and the method of an embodiment of the present invention may be caused by absorption of the X-ray fluorescence.

Nevertheless, according to the method of an embodiment of the present invention, the concentration of dopants may be measured accurately by using the look-up-table.

Figure 7B:
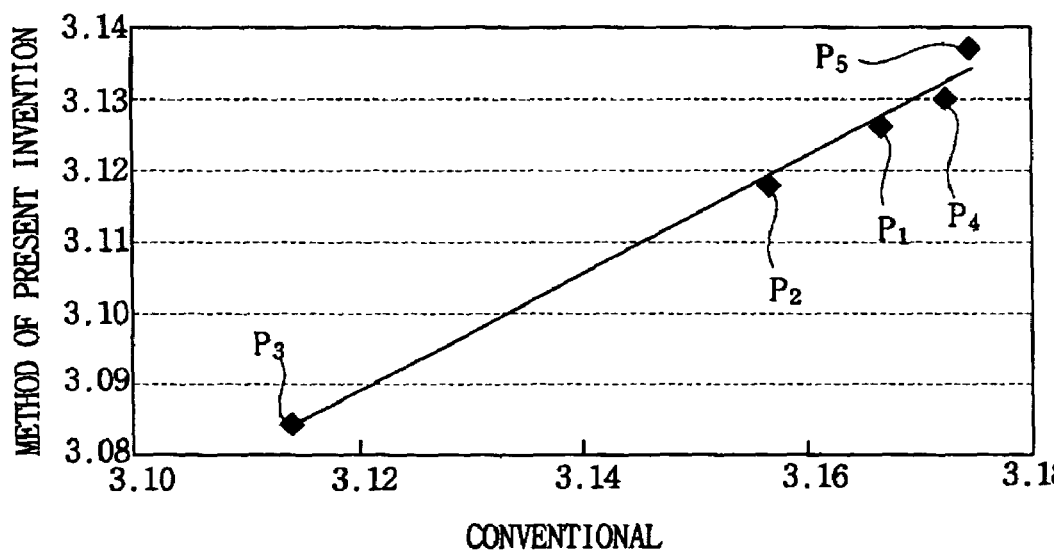
FIG. 7B is a graph showing a correlation between a conventional method of measuring a concentration of dopants and a method of measuring a concentration of dopants according to one embodiment of the present invention.

FIG. 7B is a graph showing a correlation between a conventional method of measuring a concentration of dopants and a method of measuring a concentration of dopants according to an embodiment of the present invention.

Referring to FIG. 7B, an X-axis represents intensities of the X-ray fluorescence, which are measured by a method of the present invention. The Y-axis represents intensities of the X-ray fluorescence, which are measured by a conventional method.

A correlation of the two methods is 0.993, which is a preferable number.

As has been described herein, using a method of the present invention, a concentration of dopants of an objective thin film deposited on a real wafer may be directly measured without the use of a criterion wafer, which is costly and time-intensive to produce. Therefore, the time and expense of measuring a concentration of dopants of a wafer or an objective thin film deposited on a wafer may be reduced by the method of the present invention.

In addition, because the concentration of dopants of the thin film may be easily monitored by the present invention, the concentration of dopants of wafers may be controlled and promptly corrected if necessary, thereby reducing waste and increasing productivity in a semiconductor device manufacturing process.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of measuring a concentration of dopants of an objective thin film, comprising:
   measuring a concentration of dopants of a first wafer;
   forming the objective thin film on the first wafer to form a second wafer;
   measuring a concentration of dopants of the second wafer; and
   obtaining the concentration of dopants of the objective thin film by subtracting the concentration of dopants of the first wafer from the concentration of dopants of the second wafer; wherein the concentration of dopants of the first wafer and the concentration of dopants of the second wafer are measured using X-ray fluorescence.

2. The method as claimed in claim 1, wherein measuring the concentration of dopants of the first and second wafers comprises:
   preparing a look-up-table showing a correlation between concentrations of dopants and intensities of X-ray fluorescence; and
   comparing data of the look-up-table with intensities of X-ray fluorescence intensities emitted from the first and second wafers, respectively, to measure the concentrations of dopants of the first and second wafers, respectively.

3. The method as claimed in claim 2, wherein the look-up-table is prepared by:
   recording intensities of X-ray fluorescence emitted from a wafer having a test thin film of the objective thin film while changing a concentration of dopants of the test thin film;
   checking whether sufficient data is obtained; and
   forming a table of the X-ray fluorescence intensities emitted from the wafer.

4. The method as claimed in claim 3, wherein forming the table comprises:
   writing the concentrations of dopants in a first direction; and
   writing the intensities of X-ray fluorescence, which correspond to the concentrations of dopants, in a second direction.

5. The method as claimed in claim 4, further comprising:
   forming a graph, which includes:
   representing on a first axis the concentrations of dopants;
   representing on a second axis, which is perpendicular to the first axis, the intensities of X-ray fluorescence; and
   generating points at intersections of particular intensities of X-ray fluorescence and corresponding concentrations of dopants and connecting the points to form a curve.

6. The method as claimed in claim 5, wherein the curve is formed by interpolation.

7. The method as claimed in claim 1, wherein the objective thin film comprises polysilicon.

8. The method as claimed in claim 1, wherein the objective thin film comprises amorphous silicon.

9. The method as claimed in claim 1, wherein the first and second wafers have a pattern formed thereon.

10. The method as claimed in claim 1, wherein measuring the concentration of dopants of the first and second wafers comprises:
    preparing a look-up-table including a correlation between thicknesses of test film of the objective thin film and intensities of X-ray fluorescence, and including a correlation between concentrations of dopants and intensities of X-ray fluorescence; and
    comparing data of the look-up-table with intensities of X-ray fluorescence emitted from the first and second wafers, respectively, to measure the concentration of dopants of the first and second wafers, respectively.

11. The method as claimed in claim 10, wherein the look-up-table is prepared by:
    recording intensities of X-ray fluorescence emitted from a wafer having a first test thin film of the objective thin film while changing a concentration of dopants of the first test thin film;
    recording intensities of X-ray fluorescence emitted from a wafer having a second test thin film of the objective thin film while changing a thickness of the second test thin film; and
    forming a table of the intensities of X-ray fluorescence emitted from the wafers having the first and second test thin films.

12. The method as claimed in claim 11, wherein preparing the table comprises:
    writing the concentrations of dopants in a first direction;
    writing the thicknesses in a second direction; and writing the intensities of X-ray fluorescence corresponding to the concentrations of dopants and the thicknesses at a corresponding region.

13. The method as claimed in claim 12, further comprising:
forming a graph, which includes:
representing on a first axis the concentrations of dopants;
representing on a second axis, which is perpendicular to the first axis, the thicknesses; and
representing on a third axis, which is perpendicular to the first axis and the second axis, the X-ray fluorescence intensities; and
generating points at corresponding X-ray fluorescence intensities, concentrations of dopants and thicknesses, and connecting the points to form a surface.

14. The method as claimed in claim 13, wherein the surface is formed by interpolation.

15. A method of controlling a concentration of an objective thin film, comprising:
selecting a first sample wafer;
measuring a concentration of dopants of the first sample wafer;
forming the objective thin film on the first sample wafer to form a second sample wafer;
measuring a concentration of dopants of the second sample wafer;
obtaining a concentration of dopants of the objective thin film by subtracting the concentration of dopants of the first sample wafer from the concentration of dopants of the second wafer; wherein the concentration of dopants of the first wafer and the concentration of dopants of the second wafer are measured using X-ray fluorescence;
determining whether the concentration of dopants of the objective thin film is within a predetermined allowable range of error;
continuing a process of depositing the objective thin film when the concentration of dopants of the objective thin film is within the allowable range of error; and
modulating the concentration of dopants of the objective thin film when the concentration of dopants of the objective thin film is outside of the allowable range of error.

16. The method as claimed in claim 15, wherein measuring the concentrations of dopants of the first and second sample wafers comprises:
preparing a look-up-table showing a correlation between a concentration of dopants and intensities of X-ray fluorescence of test thin films of the objective thin film; and
comparing data of the look-up-table with intensities of X-ray fluorescence emitted from the first and second sample wafers, respectively, to measure the concentrations of dopants of the first and second sample wafers, respectively.

17. The method as claimed in claim 16, wherein the look-up-table is prepared by:
recording intensities of X-ray fluorescence emitted from a wafer having a test thin film of the objective thin film while changing a concentration of dopants of the test thin film;
checking whether sufficient data is obtained; and
forming a table of the intensities of X-ray fluorescence emitted from the wafer.

18. The method as claimed in claim 17, wherein forming the table comprises:
writing the concentrations of dopants of the test thin film of the objective thin film in a first direction; and
writing the intensities of X-ray fluorescence corresponding to the concentrations of dopants in a second direction.

19. The method as claimed in claim 18, further comprising:
representing on a first axis the concentrations of dopants;
representing on a second axis, which is perpendicular to the first axis, the intensities of X-ray fluorescence; and
generating points at intersections of the intensities of X-ray fluorescence and corresponding concentrations of dopants and connecting the points to form a curve as a graph.

20. The method as claimed in claim 19, wherein the curve is formed by interpolation.

21. The method as claimed in claim 15, wherein the objective thin film comprises polysilicon.

22. The method as claimed in claim 15, wherein the objective thin film comprises amorphous silicon.

23. The method as claimed in claim 15, wherein the first and the second wafers have a pattern formed thereon.

24. The method as claimed in claim 15, wherein measuring the concentrations of dopants of the first and second sample wafers comprises:
preparing a look-up-table showing a correlation between concentrations of dopants and X-ray fluorescence intensities of test thin films of the objective thin film; and
comparing data of the look-up-table with intensities of X-ray fluorescence emitted from the first and second sample wafers, respectively, to measure the concentrations of dopants of the first and second sample wafers, respectively.

25. The method as claimed in claim 24, wherein the look-up-table is prepared by:
recording intensities of X-ray fluorescence emitted from a wafer having a first test thin film of the objective thin film while changing a concentration of dopants of the first test thin film;
recording intensities of X-ray fluorescence emitted from a wafer having a second test thin film of the objective thin film while changing a thickness of the second test thin film; and
forming a table of the intensities of X-ray fluorescence emitted from the wafers having the first and second test thin films.

26. The method as claimed in claim 25, wherein forming the table comprises:
writing the concentrations of dopants in a first direction;
writing the thicknesses in a second direction; and
writing the X-ray fluorescence intensities corresponding to the concentrations of dopants and the thicknesses at corresponding regions.

27. The method as claimed in claim 26, further comprising:
representing on a first axis the concentrations of dopants;
representing on a second axis, which is perpendicular to the first axis, the thicknesses; and
representing on a third axis, which is perpendicular to the first axis and the second axis, the intensities of X-ray fluorescence; and
generating points at corresponding intensities of X-ray fluorescence, concentrations of dopants and thicknesses, and connecting the points to form a curved plane as a graph.

28. The method as claimed in claim 27, wherein the curved plane is formed by interpolation.

29. A method of measuring a concentration of dopants of an objective thin film, comprising:

measuring an intensity of a first X-ray fluorescence emitted from a first wafer;

forming the objective thin film on the first wafer to form a second wafer;

measuring an intensity of a second X-ray fluorescence emitted from the second wafer;

obtaining an intensity of a third X-ray fluorescence emitted from the objective thin film by subtracting the intensity of the first X-ray fluorescence from the intensity of the second X-ray fluorescence; and converting the intensity of the third X-ray fluorescence emitted from the objective thin film into the concentration of dopants of the objective thin film.

30. The method as claimed in claim 29, wherein converting the third X-ray fluorescence emitted from the objective thin film into the concentration of dopants of the objective thin film comprises:

preparing a look-up-table showing a correlation between concentrations of dopants and X-ray fluorescence intensities of test thin films of the objective thin film; and comparing data of the look-up-table with the third X-ray fluorescence emitted from the objective thin film to obtain the concentration of dopants of the objective thin film.

31. The method as claimed in claim 30, wherein the look-up-table is prepared by:

recording intensities of X-ray fluorescence emitted from a wafer having a test thin film of the objective thin film while changing a concentration of dopants of the test thin film;

checking whether sufficient data is obtained; and forming a table of the intensities of the X-ray fluorescence emitted from the wafer.

32. The method as claimed in claim 31, wherein forming the table comprises:

writing the concentrations of dopants in a first direction; and writing the intensities of the X-ray fluorescence, which correspond to the concentrations of dopants, in a second direction.

33. The method as claimed in claim 31, further comprising:

representing on a first axis the X-ray fluorescence intensities;

representing on a second axis, which is perpendicular to the first axis, the concentrations of dopants; and generating points at intersections of the intensities of X-ray fluorescence and corresponding concentrations of dopants and connecting the points to form a curve as a graph.

34. The method as claimed in claim 33, wherein the curve is formed by interpolation.

* * * * *